United States Patent
Fosnight et al.

(10) Patent No.: US 10,707,108 B2
(45) Date of Patent: Jul. 7, 2020

(54) WAFER CARRIER PURGE APPARATUSES, AUTOMATED MECHANICAL HANDLING SYSTEMS INCLUDING THE SAME, AND METHODS OF HANDLING A WAFER CARRIER DURING INTEGRATED CIRCUIT FABRICATION

(71) Applicant: GLOBALFOUNDRIES, Inc., Grand Cayman (KY)

(72) Inventors: William J. Fosnight, Saratoga Springs, NY (US); Stephanie Waite, Saratoga Springs, NY (US); Stephen B. Miner, Gansevoort, NY (US); John Robinson, Saratoga Springs, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 275 days.

(21) Appl. No.: 15/872,335

(22) Filed: Jan. 16, 2018

(65) Prior Publication Data
US 2018/0138064 A1 May 17, 2018

Related U.S. Application Data

(63) Continuation of application No. 15/015,578, filed on Feb. 4, 2016, now Pat. No. 9,870,936, which is a (Continued)

(51) Int. Cl.
*H01L 21/68* (2006.01)
*H01L 21/673* (2006.01)
(Continued)

(52) U.S. Cl.
CPC .......... *H01L 21/67389* (2013.01); *B08B 5/02* (2013.01); *B08B 9/00* (2013.01);
(Continued)

(58) Field of Classification Search
CPC ......... H01L 21/67389; H01L 21/67775; H01L 21/67769; B08B 9/00; B08B 5/00; B08B 5/02
(Continued)

(56) References Cited

U.S. PATENT DOCUMENTS 5,879,458 A 3/1999 Roberson, Jr. et al.
5,988,233 A 11/1999 Fosnight et al.
(Continued)

*Primary Examiner* — Nicolas A Arnett
(74) *Attorney, Agent, or Firm* — Francois Pagette; Hoffman Warnick LLC

(57) ABSTRACT

A wafer carrier purge apparatus, an automated mechanical handling system, and a method of handling a wafer carrier during integrated circuit fabrication are provided. The wafer carrier purge apparatus includes a purge plate adapted for insertion into a carrier storage position. The purge plate includes a gas port and a gas nozzle in fluid communication with the gas port. The gas port receives a gas flow. The gas nozzle is adapted to contact an inlet port of a wafer carrier. The purge plate further includes a vacuum port and a vacuum nozzle in fluid communication with the vacuum port, spaced from the gas nozzle. The vacuum nozzle is adapted to capture gas that escapes from the wafer carrier through an outlet port of the wafer carrier. The purge plate is separate and removable from the carrier storage position.

15 Claims, 3 Drawing Sheets

Related U.S. Application Data continuation of application No. 13/910,683, filed on Jun. 5, 2013, now Pat. No. 9,257,320.

(51) Int. Cl.
*H01L 21/677* (2006.01)
*B08B 5/02* (2006.01)
*B08B 9/00* (2006.01)
*B08B 5/00* (2006.01)

(52) U.S. Cl.
CPC .. *H01L 21/67769* (2013.01); *H01L 21/67775* (2013.01); *B08B 5/00* (2013.01)

(58) Field of Classification Search
USPC ........ 141/63–66, 98; 414/935, 937, 939–940
See application file for complete search history.

(56) References Cited

U.S. PATENT DOCUMENTS

| | | |
|---|---|---|
| 6,042,651 A | 3/2000 | Roberson, Jr. et al. |
| 6,056,026 A | 5/2000 | Fosnight et al. |
| 6,164,664 A | 12/2000 | Fosnight et al. |
| 6,221,163 B1 | 4/2001 | Roberson, Jr. et al. |
| 6,319,297 B1 | 11/2001 | Fosnight |
| 6,368,411 B2 | 4/2002 | Roberson, Jr. et al. |
| 6,808,352 B2 | 10/2004 | Seita |
| RE39,241 E | 8/2006 | Fosnight |
| 8,596,312 B2* | 12/2013 | Natsume ........... H01L 21/67775 141/98 |
| 8,936,050 B2 | 1/2015 | Sugawara |
| 9,257,320 B2 | 2/2016 | Fosnight et al. |
| 9,411,332 B2 | 8/2016 | Fosnight et al. |
| 9,520,311 B2* | 12/2016 | Otsuka ............... H01L 21/67393 |
| 9,870,936 B2* | 1/2018 | Fosnight ........... H01L 21/67775 |
| 10,354,903 B2* | 7/2019 | Sakata ............. H01L 21/68707 |
| 2001/0042439 A1 | 11/2001 | Roberson, Jr. et al. |
| 2003/0049101 A1 | 3/2003 | Seita |
| 2005/0111935 A1 | 5/2005 | Kim et al. |
| 2011/0214611 A1* | 9/2011 | Kato ................. C23C 16/45519 118/719 |
| 2013/0343844 A1 | 12/2013 | Fosnight et al. |
| 2014/0360531 A1 | 12/2014 | Fosnight et al. |
| 2015/0221538 A1 | 8/2015 | Ohiai et al. |
| 2015/0234378 A1 | 8/2015 | Fosnight et al. |

\* cited by examiner

WAFER CARRIER PURGE APPARATUSES, AUTOMATED MECHANICAL HANDLING SYSTEMS INCLUDING THE SAME, AND METHODS OF HANDLING A WAFER CARRIER DURING INTEGRATED CIRCUIT FABRICATION

CROSS-REFERENCE TO RELATED APPLICATIONS

This application is a continuation of U.S. patent application Ser. No. 15/015,578, filed Feb. 4, 2016, which is a continuation of U.S. patent application Ser. No. 13/910,683, filed Jun. 5, 2013, now U.S. Pat. No. 9,257,320.

TECHNICAL FIELD

The technical field generally relates to wafer carrier purge apparatuses, automated mechanical handling systems (AMHSs) including the wafer carrier purge apparatuses, and methods of handling a wafer carrier during integrated circuit fabrication. More particularly, the technical field relates to wafer carrier purge apparatuses, AMHSs, and methods of handling the wafer carriers that enable gas to be introduced into and captured from the wafer carriers while the wafer carriers are disposed in carrier storage positions in the AMHSs during integrated circuit fabrication.

BACKGROUND

Automated mechanical handling systems (AMHSs) are widely used during integrated circuit fabrication to organize, handle, and track supplied wafers in a fabrication facility to use in fabrication of integrated circuits in the most efficient manner possible. AMHSs generally employ carrier storage positions, e.g., storage positions in a stocker or zero footprint storage bins. The carrier storage positions are adapted to receive a wafer carrier, such as a front opening shipping box (FOSB). The AMHSs also generally include a container transporter that is adapted to move the FOSBs into and out of the carrier storage positions. During handling, FOSBs that include the supplied wafers are removed from the carrier storage positions and unwrapped, followed by placing the supplied wafers and an empty front opening unified pod (FOUP) on a sorter. The FOUP allows the supplied wafers to be accessed during automated integrated circuit fabrication. The supplied wafers are transferred to the empty FOUP on the sorter. The FOUP is then generally returned to the carrier storage position, where the FOUP remains until the supplied wafers are needed.

Queue times during automated integrated circuit fabrication have a significant impact on integrated circuit quality due to environmental impact on materials that are used to fabricate the integrated circuits. In particular, prolonged exposure to moisture or other airborne environmental contaminants such as organic compounds and ions can lead to corrosion and/or crystallization on the wafers, thereby resulting in out-of-specification integrated circuits that must be discarded or reworked. To avoid excessive queue times, fabrication facilities often employ production holds at various stages in the fabrication to ensure that queue times are not exceeded that would otherwise result in rework and scrap of fabricated integrated circuits. Wafer Environment Control (WEC) solutions are another option that has been considered to prevent contamination of the supplied wafers from moisture and organic compounds that may be present in the ambient atmosphere surrounding the carrier storage positions while the supplied wafers are stored. The WEC solutions, in principle, provide a chemically inert environment surrounding the supplied wafers while the supplied wafers await use during integrated circuit fabrication, thereby rendering long queue times immaterial to product quality. However, existing WEC solutions generally require additional process steps or major tool modifications, thereby rendering the WEC solutions impractical for implementation in existing fabrication facilities.

Accordingly, it is desirable to provide apparatuses, systems for integrated circuit fabrication, and methods that enable wafer environment control to be readily implemented into existing process steps without significant tool modification. Furthermore, other desirable features and characteristics of the present invention will become apparent from the subsequent detailed description of the invention and the appended claims, taken in conjunction with the accompanying drawings and this background of the invention.

BRIEF SUMMARY

A wafer carrier purge apparatus, an automated mechanical handling system for integrated circuit fabrication, and a method of handling a wafer carrier during integrated circuit fabrication are provided. In an embodiment, a wafer carrier purge apparatus includes a purge plate that is adapted for insertion into a carrier storage position. The purge plate includes a gas port and a gas nozzle in fluid communication with the gas port. The gas port receives an gas flow. The gas nozzle is adapted to contact an inlet port of a wafer carrier for introducing a gas into the wafer carrier. The purge plate further includes a vacuum port and a vacuum nozzle in fluid communication with the vacuum port, spaced from the gas nozzle. The vacuum nozzle is adapted to capture gas that escapes from the wafer carrier through an outlet port of the wafer carrier. The purge plate is separate and removable from the carrier storage position.

In another embodiment, an automated mechanical handling system is provided for integrated circuit fabrication. The system includes a plurality of storage positions that are adapted to receive a wafer carrier. A container transporter is adapted to move the wafer carrier into and out of the plurality of carrier storage positions. The system further includes a wafer carrier purge apparatus that includes a purge plate that is adapted for insertion into one of the plurality of carrier storage positions. The purge plate includes a gas port and a gas nozzle in fluid communication with the gas port. The gas port receives a gas flow. The gas nozzle is adapted to contact an inlet port of a wafer carrier for introducing gas into the wafer carrier. The purge plate further includes a vacuum port and a vacuum nozzle in fluid communication with the vacuum port, spaced from the gas nozzle. The vacuum nozzle is adapted to capture gas from the wafer carrier through an outlet port of the wafer carrier. The purge plate is separate and removable from the carrier storage position.

In another embodiment, a method of handling a wafer carrier during integrated circuit fabrication is provided. The wafer carrier has an inlet port and an outlet port, and the method includes loading the wafer carrier into a carrier storage position. A plurality of the carrier storage positions is provided, and a purge plate is disposed in each carrier storage position. The purge plate includes a gas port and a gas nozzle in fluid communication with the gas port. The gas port receives a gas flow. The gas nozzle is adapted to contact the inlet port of a wafer carrier. The purge plate further includes a vacuum port and a vacuum nozzle in fluid communication with the vacuum port, spaced from the gas nozzle. The vacuum nozzle is adapted to capture gas that escapes from the wafer carrier through the outlet port of the wafer carrier. The presence of the wafer carrier is sensed in the carrier storage position with a presence sensor that is in electrical communication with a control module that is adapted to control gas flow through the gas nozzles and vacuum applied to the vacuum nozzles for at least two of the purge plates. Gas flow is provided through the gas nozzle and vacuum is applied to the vacuum nozzle for all purge plates that are controlled by the control module upon sensing the presence of the wafer carrier in the carrier storage position.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

Automated mechanical handling systems, wafer carrier purge apparatuses, and methods of handling a wafer carrier during integrated circuit fabrication are provided herein. The wafer carrier purge apparatuses include a purge plate that is adapted for insertion into a carrier storage position, e.g., a storage position of a stocker or a zero footprint storage (ZFS) bin, and that is adapted to introduce gas into and remove gaseous contents from a wafer carrier upon placing the wafer carrier in the carrier storage position. In particular, the purge plate has a gas nozzle that is adapted to contact an inlet port of the wafer carrier for introducing gas into the wafer carrier, and a vacuum nozzle that is spaced from the gas nozzle and adapted to capture gas that escapes from the wafer carrier through an outlet port of the wafer carrier. By providing the gas nozzle and the vacuum nozzle on the purge plate, the gas nozzle and the vacuum nozzle are precisely pre-positioned to align with existing inlet and outlet ports in the wafer carrier. The purge plate is separate and removable from the carrier storage position, with placement of the purge plate within the carrier storage position enabling simple retrofit of existing stockers or ZFS units with the wafer carrier purge apparatus. By "separate and removable", it is meant that the purge plate is not an integrated element of the carrier storage position and can possibly be removed after installation while still enabling the carrier storage position to function within the automated mechanical handling system (i.e., without rendering the carrier storage position inoperable and incapable of receiving the wafer carrier albeit without wafer carrier purging functionality). In an embodiment, the wafer carrier purge apparatus may be integrated into existing AMHSs, with the purge plate inserted and secured in the carrier storage position to provide purging capabilities to the AMHS. Gas may be circulated through the wafer carrier while the wafer carrier is stored in the carrier storage position, thereby avoiding any need to add process steps to effectuate wafer environment control. With the gas circulation provided by the wafer carrier purge apparatus, the effect of queue times on integrated circuit quality can be minimized with maximized product yields achieved.

Figure 1:
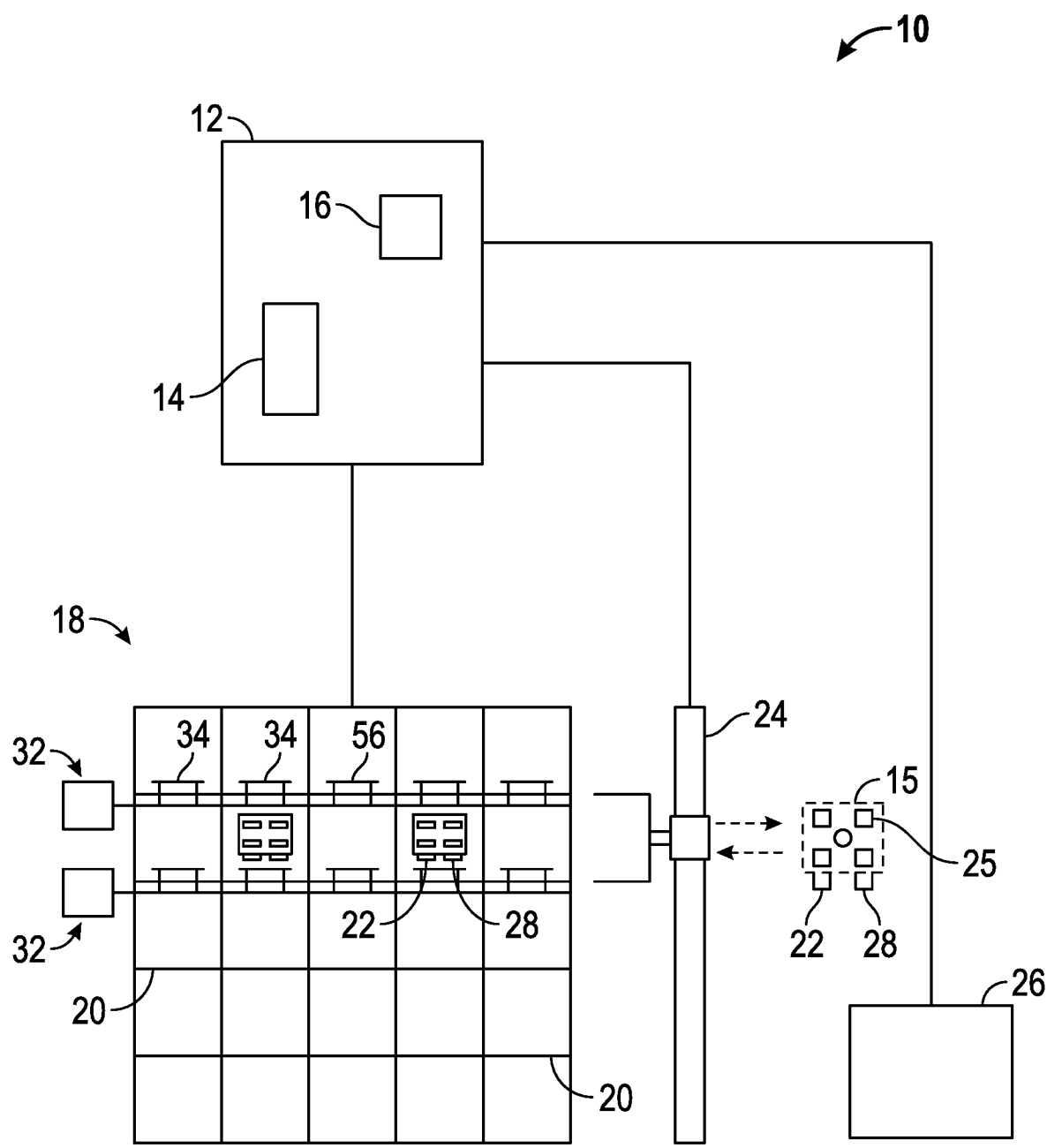
FIG. 1 is an automated mechanical handling system in accordance with an embodiment.

An embodiment of an automated mechanical handling system (AMHS) 10 and an embodiment of a wafer carrier purge apparatus 32 that may be used in the AMHS 10 will now be described with reference to FIGS. 1-3. In an embodiment and as shown in FIG. 1, the AMHS 10 includes a stocker 18 that has a plurality of carrier storage positions 20, with the carrier storage positions 20 adapted to receive a wafer carrier 15 that includes supplied wafers 25. As referred to herein, the wafer carrier 15 of interest is also known in the art as a front opening unified pod (FOUP) and is the container to which the supplied wafers 25 are transferred and within which the supplied wafers 25 remain until a production lotstart 26 is ready to receive the wafer carrier 15. However, in other embodiments, it is to be appreciated that carrier storage positions may be ZFS bins or may also be adapted to receive other types of containers such as front opening shipping boxes (FOSBs), which contain supplied wafers 25 that are provided directly from a supplier and which may be stored until the supplied wafers 25 are ready to be transferred to the FOUP 15 in accordance with convention waferstart process flows. The wafer carrier 15 includes an inlet port 22 and an outlet port 28 for enabling gases to be introduced into and removed from the wafer carrier 15, thereby facilitating purging with the wafer carrier purge apparatus 32. The stocker 18 stores and maintains the wafer carriers 15 in the carrier storage positions 20 to enable organization and storage of the wafer carriers 15 until the production lotstart 26 is ready to receive the supplied wafers 25. A container transporter 24 is adapted to move the wafer carrier 15 into and out of the plurality of carrier storage positions 20 in the stocker 18.

The AMHS 10 may further include a system computer 12 that includes a data input interface 14 and a storage medium 16 for registering supplied wafers 25 and tracking locations of the supplied wafers 25 through the fabrication facility. The data input interface 14 can be a user interface, such as a keyboard and visual display, for manually entering data into the system computer 12. Alternatively, the data input interface 14 can be an interface that enables electronic transfer of data into the system computer 12 from an external source, e.g., a USB port, wireless or wired network connection that is open to receiving the data, and the like. The container transporter 24 may be controlled by the system computer 12, with the system computer 12 adapted to control movement of the wafer carriers 15 into and out of the plurality of carrier storage positions 20 in the stocker 18 using the container transporter 24.

In an embodiment and as shown in FIG. 1, the AMHS 10 further includes the wafer carrier purge apparatus 32. However, it is to be appreciated that in other embodiments, the wafer carrier purge apparatus 32 is provided independent of the AMHS 10 and may be provided for modification of existing AMHSs. Referring to FIG. 1, the wafer carrier purge apparatus 32 includes a purge plate 34 that is adapted for insertion into one of the plurality of carrier storage positions 20. The purge plate 34 is separate and removable from the carrier storage position 20 of the stocker 18 within which the purge plate 34 is inserted during use in the AMHS 10. However, the purge plate 34 may be secured to the carrier storage position 20 to precisely position the purge plate 34 in a proper location where the container transporter 24 is configured to place the wafer carrier 15 in the carrier storage position 20. In an embodiment and as shown in FIG. 2, the purge plate 34 includes a fastening feature 36 to facilitate attachment of the purge plate 34 to the carrier storage position 20 of the stocker 18. For example, the fastening feature 36 may be a bore or groove 36 that receives a bolt (not shown) for fastening the purge plate 34 to the stocker 18. Alternatively, in other embodiments and although not shown, the fastening feature can be a mating tab, latch, magnet, or other feature that enables precise placement of the purge plate 34 in the carrier storage positions 20 and that maintains the purge plate 34 in place.

Figure 2:
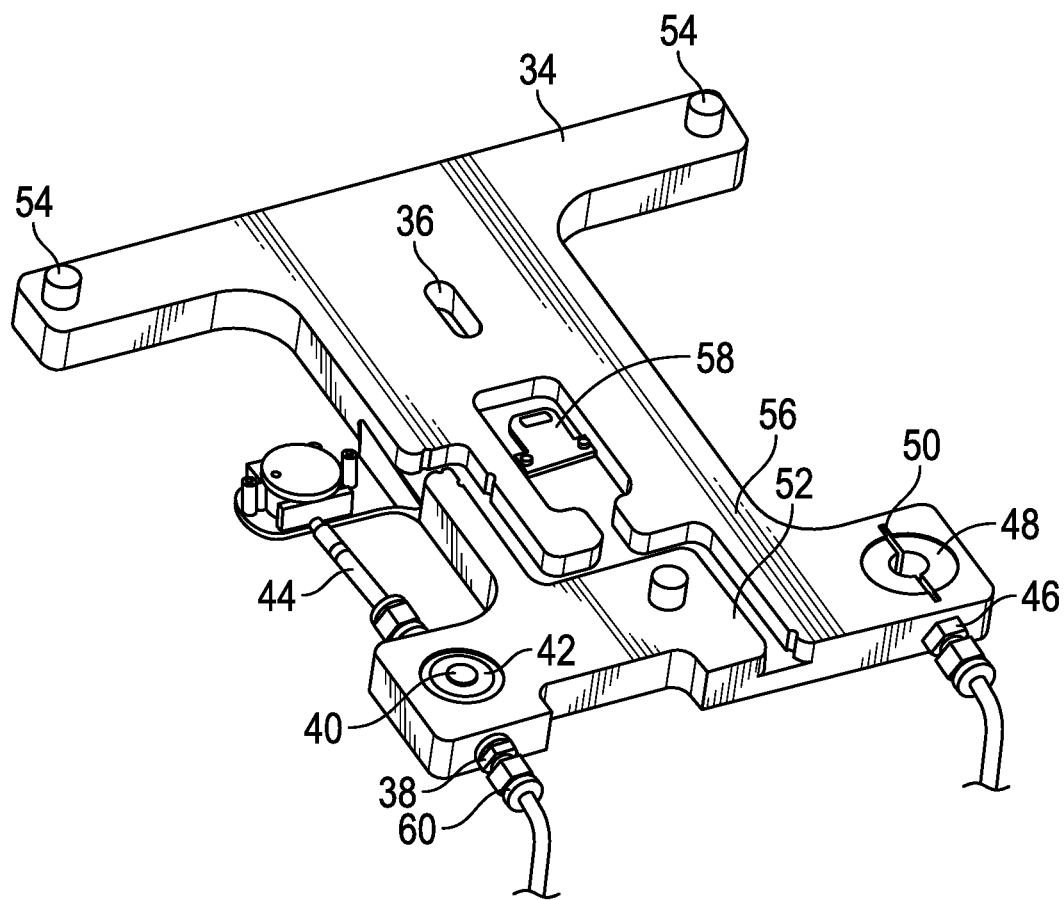
FIG. 2 is perspective schematic view of a wafer carrier purge apparatus including a purge plate for use in the automated mechanical handling system of FIG. 1 in accordance with an embodiment.

Referring to FIG. 2, the purge plate 34 includes a gas port 38 for receiving a gas flow. The gas that is provided to the purge plate 34 can be any gas that is generally unreactive under ambient conditions, such as a noble gas or nitrogen. Alternatively, the gas that is provided to the purge plate 34 may be clean, dry air. In a specific embodiment, the gas is nitrogen. The gas provided through the port may be substantially pure inert gas, e.g., 99 weight % pure inert gas such as nitrogen, or may be a mixture of gases. The purge plate 34 further include a gas nozzle 40 that is in fluid communication with the gas port 38 and that is adapted to contact the inlet port of the wafer carrier for introducing gas into the wafer carrier. The gas nozzle 40 may have any configuration that enables a physical seal to be formed between the gas nozzle 40 and the inlet port of the wafer carrier. For example, the gas nozzle 40 may provide a mating connection with the inlet port of the wafer carrier, or may provide a connection that is designed to seal with the inlet port upon the wafer carrier being placed on the purge plate 34. As a specific example and as shown in FIG. 2, a gasket 42 may be disposed about the gas nozzle 40 to seal the connection between the gas nozzle 40 and the inlet port of the wafer carrier when the wafer carrier is disposed on the purge plate 34.

In an embodiment and as shown in FIG. 2, a pressure sensor 44 may be disposed between and in fluid communication with the gas port 38 and the gas nozzle 40 to monitor flow of gas between the gas port 38 and the gas nozzle 40. In particular, a fluid channel of the pressure sensor 44 may be in fluid communication with a fluid channel between the gas port 38 and the gas nozzle 40 to provide a measurement location for the fluid sensor between the gas port 38 and the gas nozzle 40. The pressure sensor 44 may be employed to assist with detecting whether proper alignment of the inlet port of the wafer carrier and the gas nozzle 40 has been achieved. In particular, a pressure buildup sensed by the pressure sensor 44 may be an indication that the gas nozzle 40 is blocked and that gas is not flowing into the inlet port of the wafer carrier, which could result in failure to effectively purge the wafer carrier.

As shown in FIG. 2, the purge plate 34 further includes a vacuum port 46 and a vacuum nozzle 48 that is in fluid communication with the vacuum port 46. The vacuum nozzle 48 is spaced from the gas nozzle 40, and the vacuum nozzle is adapted to capture gas that escapes from the wafer carrier through the outlet port 28 of the wafer carrier. In this regard, the vacuum port 46 enables circulation of the gas that is provided to the wafer carrier from the gas nozzle 40 through the inlet port of the wafer carrier and out through the outlet port and the vacuum nozzle 48 under the influence of vacuum applied to the vacuum nozzle 48 through the vacuum port 46. Whereas a seal between the gas nozzle 40 and the inlet port of the wafer carrier is generally established, the purge plate 34 may define a pressure relief feature 50 that is in fluid communication with the vacuum nozzle 48 and the vacuum port 46 to prevent sealing between the vacuum nozzle 48 and the wafer carrier. The pressure relief feature 50 enables gas to be captured from the wafer carrier as it escapes through the outlet port without evacuating the wafer carrier and without rendering separation of the wafer carrier from the purge plate 34 difficult. In an embodiment and as shown in FIG. 2, the pressure relief feature 50 may be a gap that extends across the vacuum nozzle 48 and that allows ambient air from outside of the wafer carrier to pass into the vacuum nozzle 48 when the outlet port of the wafer carrier is disposed on the vacuum nozzle 48. However, although not shown, it is to be appreciated that other pressure relief features may be employed such as, for example, a pressure relief valve disposed between the vacuum nozzle 48 and the vacuum port 46.

The purge plate 34 may have various features to ensure that proper alignment is achieved between the wafer carrier and the purge plate 34. For example, as shown in FIG. 2, the purge plate 34 may have an integral structure 52 that connects the gas port 38, the gas nozzle 40, the vacuum port 46, and the vacuum nozzle 48, i.e., the purge plate 34 may have a one-piece construction. In this manner, constant and precise spacing may be maintained between the gas nozzle 40 and the vacuum nozzle 48. Additionally and referring to FIG. 2, the purge plate 34 is adapted to receive the wafer carrier on a contact surface 56, and the gas nozzle 40 and the vacuum nozzle 48 are both located on the contact surface 56. The contact surface 56, as referred to herein, is the surface of the purge plate 34 that physically contacts the wafer carrier when the wafer carrier is disposed in the carrier storage position. In an embodiment, the purge plate 34 includes an alignment feature 54 that is disposed on the contact surface 56 of the purge plate 34 for aligning the inlet port and the outlet port 28 of the wafer carrier with the gas nozzle 40 and the vacuum nozzle 48, respectively. It is to be appreciated that various alignment features are known in the art, including alignment features that enable alignment through a mating configuration, magnetic attraction, and the like. For example and as shown in FIG. 2, the alignment feature 54 may include one or more kinematic pins that are precisely positioned to mate with corresponding grooves (not shown) in the wafer carrier.

In an embodiment and as shown in FIG. 1, the purge plate 34 is configured to be disposed on a bottom surface of the carrier storage position 20, with the contact surface 56 facing into the carrier storage position 20 and with the wafer carrier 15 resting on the contact surface 56 of the purge plate 34 upon placement into the carrier storage position 20. With the purge plate 34 disposed on the bottom surface of the carrier storage position 20, gravitational forces may be sufficient to adequately maintain connection between the inlet port 22 of the wafer carrier 15 and the gas nozzle of the purge plate 34.

In an embodiment and referring again to FIG. 2, a presence sensor 58 is disposed on the contact surface 56 of the purge plate 34 for registering a presence or absence of the carrier wafer in the carrier storage position 20. The presence sensor 58 may function through any sensing mechanism, such as optical or physical sensing mechanisms. For example, in an embodiment, the presence sensor 58 includes a photoelectric sensor 58. In an embodiment, the presence sensor 58 is employed to provide a binary output correlated to either the presence or the absence of the wafer carrier in the carrier storage position 20, as described in further detail below in accordance with an exemplary method of handling the wafer carrier during integrated circuit fabrication.

Figure 3:
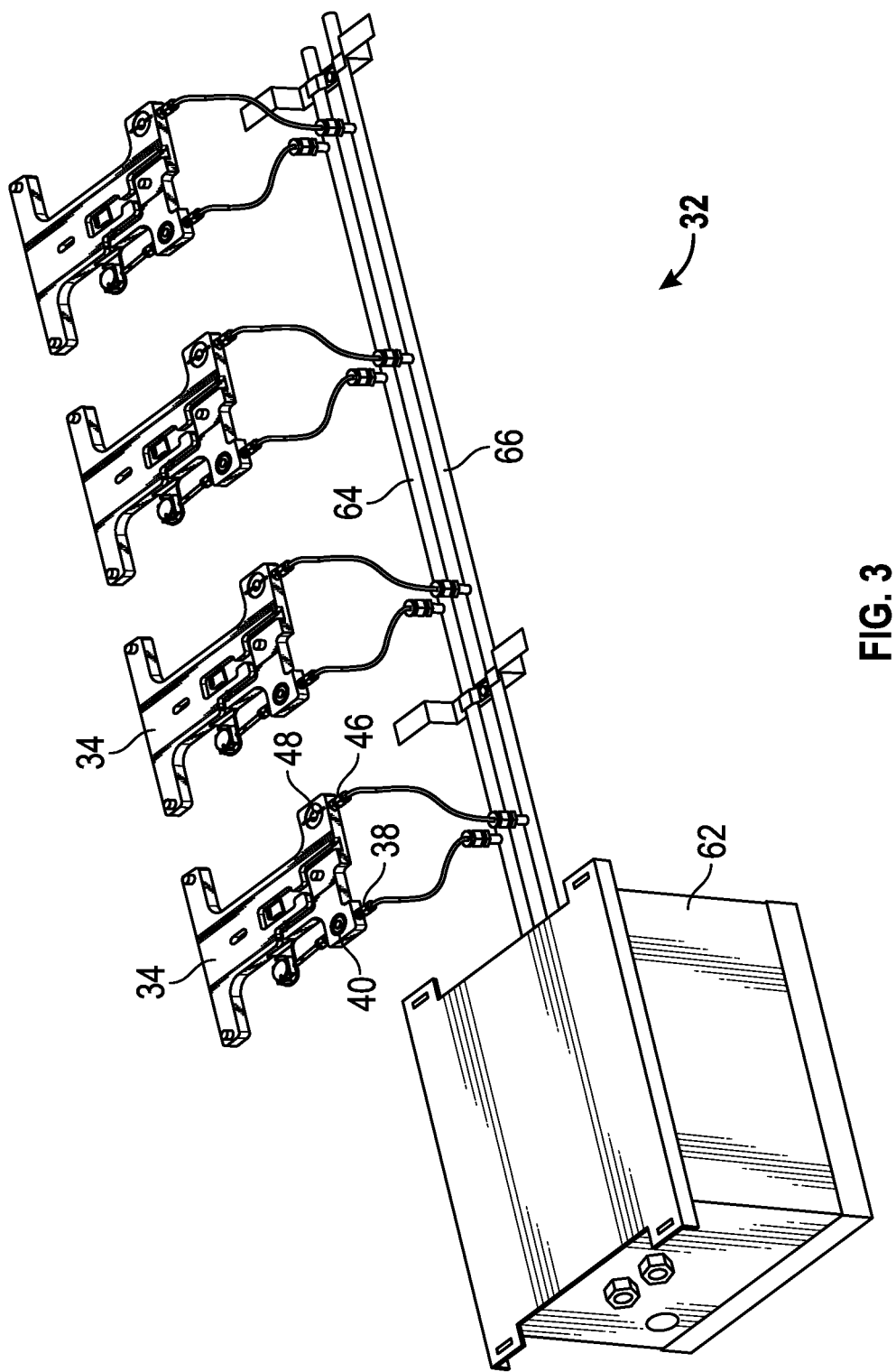
FIG. 3 is a perspective schematic view of the purge plate of FIG. 2 in accordance with an embodiment.

In an embodiment and as shown in FIG. 3, the wafer carrier purge apparatus 32 further includes a control module 62, an gas manifold 64 in fluid communication with the gas port 38, and a vacuum manifold 66 in fluid communication with the vacuum port 46. The control module 62 is adapted to control fluid flow in the gas manifold 64 and the vacuum manifold 66. In this embodiment, the wafer carrier purge apparatus 32 may include an additional purge plate 34, with the gas manifold 64 and the vacuum manifold 66 in fluid communication with the gas port 38 and the vacuum port 46 of each of the purge plates 34. The presence sensors may be in electrical communication with the control module 62, with the control module 62 adapted to control gas flow through the gas nozzles and vacuum applied to the vacuum nozzles for the purge plates 34.

In an embodiment and referring again to FIG. 2, a flow regulator 60 is disposed between and in fluid communication with the gas port 38 and the gas nozzle 40 to influence flow of the gas from the gas port 38 through the gas nozzle 40. The flow regulator 60 may be any element that influences flow of the gas through the gas nozzle 40, such as a critical orifice 60, flow control valve or the like. In an embodiment, the flow regulator 60 only influences flow of the gas through the gas nozzle 40, but does not stop flow. For example, in an embodiment, the flow regulator 60 is the critical orifice 60. The critical orifice 60 may be a region of a flow channel for the gas that has a lesser inner diameter than upstream and downstream portions of the flow channel. When a difference in pressure between downstream and upstream portions of the flow channel relative to the critical orifice 60 reaches a threshold value, velocity of the gas through the orifice reaches the speed of sound and no further increase in flow rate will generally occur, i.e., the flow becomes "critical". The critical orifice 60 may be employed to provide a steady supply of gas through the gas nozzle 40 upon a wafer carrier being sensed on the purge plate 34, and a plurality of the purge plate 34 may be connected in parallel to a single gas source that provides the gas at a sufficiently high pressure to maintain gas flow through all of the critical orifices of the purge plates 34. In a further embodiment and referring to FIG. 3, the wafer carrier purge apparatus 32 is free from shutoff valves that are disposed between the gas manifold 64 and the gas nozzle 40 and between the vacuum manifold 66 and the vacuum nozzle 48. In this manner, only the control module 62 controls gas flow and vacuum.

An embodiment of a method of handling a wafer carrier during integrated circuit fabrication will now be described using the AMHS and wafer carrier purge apparatus 32 shown in FIGS. 1-3. In accordance with the exemplary method, safeguards are put in place to both ensure that gas is flowing to the wafer carrier 15 and that gas flow is properly ceased when appropriate. In an embodiment of the exemplary method, a plurality of the carrier storage positions 20 are provided with a purge plate 34 disposed in each carrier storage position 20. A wafer carrier 15 is loaded into a carrier storage position 20, whereupon the presence of the wafer carrier 15 in the carrier storage position 20 is sensed with the presence sensor 58. The presence sensor 58 is in electrical communication with the control module 62 for registering the presence or absence of carrier wafers adjacent to any purge plate 34 that is controlled by the control module 62. Gas flow is then provided through the gas nozzle 40 and vacuum is applied to the vacuum nozzle 48 for all purge plates 34 that are controlled by the control module 62 upon sensing the presence of the wafer carrier 15 in the carrier storage position 20. In particular, even if the presence of only a single wafer carrier 15 is sensed adjacent to a single purge plate 34, with additional purge plates 34 controlled by the control module 62 registering the absence of a wafer carrier 15, the control module 62 still directs gas flow and applies the vacuum for all of the purge plates 34. Due to the use of the flow regulator 60, sufficient amounts of gas may be provided to each purge plate 34 in this embodiment to effect purging without significant cost impact of wasted gas that is passed to empty purge plates 34. It is to be appreciated that in other embodiments of suitable methods, other schemes may be employed to selectively direct gas only to purge plates 34 where the presence of a wafer carrier 15 is detected, although such methods may require more complex control modules and wafer carrier 15 purge apparatuses.

In an embodiment, the method further includes sensing flow of gas between the gas port 38 and the gas nozzle 40 using, e.g., the pressure sensor 44. By sensing flow of the gas between the gas port 38 and the gas nozzle 40, a determination can be made of whether the wafer carrier 15 that is disposed adjacent to the purge plate 34 is being properly purged. For example, a pressure buildup sensed by the pressure sensor 44 may be an indication that the gas nozzle 40 is blocked and that gas is not properly flowing into the inlet port 22 of the wafer carrier 15, which could result in failure to effectively purge the wafer carrier 15. In an embodiment, an error function is initiated using the control module 62 upon sensing the presence of the wafer carrier 15 with the presence sensor 58 and further upon sensing insufficient flow between the gas port 38 and the gas nozzle 40 with the pressure sensor 44. In a further embodiment, an error function may be initiated using the control module 62 upon sensing no presence of the wafer carrier 15 with the presence sensor 58 and further upon sensing flow between the gas port 38 and the gas nozzle 40 with the pressure sensor 44, which could be an indication of malfunction of the wafer carrier purge apparatus 32.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:
1. A wafer carrier purge apparatus comprising:
  a purge plate adapted for insertion into a carrier storage position, wherein the purge plate comprises:
    a body having a contact surface;
    a first protrusion extending outward from the body;
    a second protrusion extending outward from the body and substantially aligned with the first protrusion;
  a gas nozzle on the first protrusion and adapted to contact an inlet port of a wafer carrier for introducing gas into the wafer carrier; and
  a vacuum nozzle on the second protrusion and adapted to capture gas that escapes from the wafer carrier through an outlet port of the wafer carrier, an alignment feature located on the contact surface of the body of the purge plate, wherein the alignment feature is linearly between the gas nozzle and the vacuum nozzle;

wherein the purge plate is separate and removable from the carrier storage position.

2. The wafer carrier purge apparatus of claim 1, wherein the gas nozzle is located on the contact surface of the purge plate that is adapted to contact the wafer carrier.

3. The wafer carrier purge apparatus of claim 1, further comprising a presence sensor located on the contact surface for registering a presence or absence of the wafer carrier in the carrier storage position.

4. The wafer carrier purge apparatus of claim 3, wherein the presence sensor comprises a photoelectric sensor.

5. The wafer carrier purge apparatus of claim 3, wherein the purge plate comprises an integral structure connecting the gas nozzle and the presence sensor.

6. The wafer carrier purge apparatus of claim 1, wherein the purge plate comprises a fastening feature to facilitate attachment of the purge plate to the carrier storage position.

7. The wafer carrier purge apparatus of claim 1, further comprising a pressure sensor for monitoring flow of gas to the gas nozzle and the pressure sensor detects whether proper alignment of the gas and inlet port of the wafer carrier is achieved.

8. The wafer carrier purge apparatus of claim 1, wherein the purge plate further comprises an alignment feature for aligning the inlet port of the wafer carrier with the gas nozzle.

9. The wafer carrier purge apparatus of claim 8, wherein the purge plate comprises an integral structure connecting the gas nozzle and the alignment feature.

10. The wafer carrier purge apparatus of claim 1, further comprising a control module and, a gas manifold in fluid communication with the gas nozzle, wherein the control module is adapted to control fluid flow in the gas manifold.

11. The wafer carrier purge apparatus of claim 10, further comprising an additional purge plate, wherein the gas manifold is in fluid communication with the gas nozzle of the additional purge plate.

12. The wafer carrier purge apparatus of claim 11, wherein the wafer carrier purge apparatus is free from shutoff valves disposed between the gas manifold and the gas nozzle.

13. A wafer carrier purge apparatus comprising:
a purge plate adapted for insertion into a carrier storage position, wherein the purge plate comprises:
a body having a contact surface;
a first protrusion extending outward from the body;
a second protrusion extending outward from the body and substantially aligned with the first protrusion;
a fastening feature shaped for attachment of the purge plate to the carrier storage position;
a gas nozzle on the first protrusion and adapted to contact an inlet port of a wafer carrier for introducing gas into the wafer carrier;
a vacuum nozzle on the second protrusion and adapted to capture gas that escapes from the wafer carrier through an outlet port of the wafer carrier,
an alignment feature located on the contact surface of the body of the purge plate, wherein the alignment feature is linearly between the gas nozzle and the vacuum nozzle;
a presence sensor mounted on the contact surface of the body between the fastening feature and the alignment feature, wherein the presence sensor detects the carrier storage position; and
a pressure sensor oriented perpendicularly with respect to the fastening feature, the presence sensor, and the alignment feature, the pressure sensor configured to monitor the flow of gas to the gas nozzle and to detect whether the gas port is aligned with the inlet port of the wafer carrier,
wherein the purge plate is separate and removable from the carrier storage position.

14. The wafer carrier purge apparatus of claim 13, wherein the presence sensor is located on the contact surface for registering a presence or absence of the wafer carrier in the carrier storage position.

15. A wafer carrier purge apparatus comprising:
a purge plate having a one piece construction adapted for insertion into a carrier storage position, wherein the purge plate comprises:
a body having a contact surface;
a first protrusion extending outward from the body;
a second protrusion extending outward from the body and substantially aligned with the first protrusion;
a gas nozzle on the first protrusion for introducing gas into the wafer carrier;
a gas port for receiving a gas flow in fluid communication with the gas nozzle and adapted to contact an inlet port of a wafer carrier;
a vacuum port on the second protrusion;
a vacuum nozzle for removing gas from the wafer carrier and in fluid communication with the vacuum port;
an alignment feature located on the contact surface of the body of the purge plate, wherein the alignment feature is linearly between the gas nozzle and the vacuum nozzle; and
a channel separating the gas nozzle and vacuum nozzle, wherein the channel extends across the body between a first end and a second end, the second end is between the first protrusion and the second protrusion of the body, and wherein the second end is oriented perpendicularly with respect to the first end,
wherein the purge plate is separate and removable from the carriage storage position.

* * * * *